(12) United States Patent
Wang et al.

(10) Patent No.: US 12,356,568 B2
(45) Date of Patent: Jul. 8, 2025

(54) ELECTRONIC DEVICE WITH THE FOLDED STATE AND UNFOLDED STATE

(71) Applicant: HUAWEI TECHNOLOGIES CO., LTD., Guangdong (CN)

(72) Inventors: Shengchao Wang, Shenzhen (CN); Chong Xing, Xi'an (CN); Zhangmin Bao, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 317 days.

(21) Appl. No.: 17/774,336

(22) PCT Filed: Nov. 5, 2020

(86) PCT No.: PCT/CN2020/126794
§ 371 (c)(1),
(2) Date: May 4, 2022

(87) PCT Pub. No.: WO2021/088928
PCT Pub. Date: May 14, 2021

(65) Prior Publication Data
US 2022/0408579 A1    Dec. 22, 2022

(30) Foreign Application Priority Data
Nov. 6, 2019    (CN) .......................... 201911077714.1

(51) Int. Cl.
*H05K 5/02*    (2006.01)
*F16C 3/02*    (2006.01)
(52) U.S. Cl.
CPC ............. *H05K 5/0226* (2013.01); *F16C 3/02* (2013.01)

(58) Field of Classification Search
None
See application file for complete search history.

(56) References Cited

U.S. PATENT DOCUMENTS 6,114,958 A * 9/2000 Murphy ................ G06F 1/1616
340/568.1
8,593,800 B2 * 11/2013 Asakura ................ G06F 1/1681
361/679.28

(Continued)

FOREIGN PATENT DOCUMENTS

CN    101939982 A    1/2011
CN    103354603 A    10/2013
(Continued)

*Primary Examiner* — James Wu
*Assistant Examiner* — Christopher L Augustin
(74) *Attorney, Agent, or Firm* — WOMBLE BOND DICKINSON (US) LLP

(57) ABSTRACT

An electronic device includes: a rotating shaft; a first enclosure and a second enclosure, where the first enclosure is rotatably connected to the second enclosure through the rotating shaft, the first enclosure includes a first electric-conductor, the second enclosure includes a second electric-conductor, and the first electric-conductor is electrically connected to the second electric-conductor through the rotating shaft when the first enclosure and the second enclosure are in an unfolded state; a first elastic component, where the first elastic component is electrically conductive, and the first elastic component is disposed in the first enclosure; and the first electric-conductor is electrically connected to the second electric-conductor through the first elastic component when the first enclosure and the second enclosure are in a folded state.

20 Claims, 15 Drawing Sheets

(56) References Cited

U.S. PATENT DOCUMENTS

| | | | |
|---|---|---|---|
| 2004/0051801 A1 | 3/2004 | Iizuka et al. | |
| 2006/0046792 A1* | 3/2006 | Hassemer | H04M 1/0216 |
| | | | 455/575.1 |
| 2006/0133019 A1* | 6/2006 | Yamazaki | G06F 1/1679 |
| | | | 361/679.21 |
| 2006/0273964 A1 | 12/2006 | Kanazawa | |
| 2007/0021161 A1* | 1/2007 | Autti | H01Q 9/0421 |
| | | | 455/575.7 |
| 2007/0184709 A1* | 8/2007 | Dombrowski | G06F 1/1616 |
| | | | 439/495 |

FOREIGN PATENT DOCUMENTS

| | | |
|---|---|---|
| CN | 103685999 A | 3/2014 |
| CN | 105679780 A | 6/2016 |
| CN | 106355996 A | 1/2017 |
| CN | 207184560 U | 4/2018 |
| CN | 109167154 A | 1/2019 |
| CN | 109638451 A | 4/2019 |
| CN | 209015004 U | 6/2019 |
| CN | 209029529 U | 6/2019 |
| CN | 212163393 U | 12/2020 |
| JP | 2006217410 A | 8/2006 |
| WO | 2019041974 A1 | 3/2019 |
| WO | 2020119357 A1 | 6/2020 |

\* cited by examiner

ELECTRONIC DEVICE WITH THE FOLDED STATE AND UNFOLDED STATE

This application is a National Stage of International Application No. PCT/CN2020/126794, filed on Nov. 5, 2020, which claims priority to Chinese Patent Application No. 201911077714.1, filed on Nov. 6, 2019. Both of the aforementioned applications are hereby incorporated by reference in their entireties.

TECHNICAL FIELD

This application relates to the field of electronic device technologies, and in particular, to an electronic device.

BACKGROUND

In recent years, with development of flexible screen technologies, structures such as folding structures of some electronic devices with display screens are implemented, for example, folding screen mobile phones and folding screen wearable devices. In an electronic device, an antenna structure usually needs to be provided for communication.

The antenna structure, for example, an antenna, provided in the electronic device usually needs to be fed and grounded. The grounding requires connection to a common ground terminal of the electronic device, and the common ground terminal is generally a middle frame, a housing, or the like of the electronic device.

A morphological structure of a non-folding electronic device does not change. A position for disposing an antenna is determined during production, and a length of a grounding path does not change. However, a morphological structure of a folding electronic device changes with a folding status. Further, a length of a grounding path of the antenna may not be the shortest. Consequently, performance of the antenna and interference are affected.

SUMMARY

Embodiments of this application provide an electronic device to reconstruct a grounding path of an antenna when the electronic device is in a folded state, so as to prevent deterioration of performance of the antenna.

To achieve the foregoing objective, the following technical solutions are used in embodiments of this application.

An embodiment of this application provides an electronic device. The electronic device includes: a rotating shaft;
a first enclosure and a second enclosure, where the first enclosure is rotatably connected to the second enclosure through the rotating shaft, the first enclosure includes a first electric-conductor, the second enclosure includes a second electric-conductor, and the first electric-conductor is electrically connected to the second electric-conductor through the rotating shaft when the first enclosure and the second enclosure are in an unfolded state;
a first elastic component, where the first elastic component is electrically conductive, and the first elastic component is disposed in the first enclosure; and
the first electric-conductor is electrically connected to the second electric-conductor through the first elastic component when the first enclosure and the second enclosure are in a folded state.

According to an embodiment, because the first enclosure is provided with the first elastic component, the first elastic component may electrically connect the first enclosure to the second enclosure when the first enclosure and the second enclosure are in the folded state. In this way, a grounding path is reconstructed in the folded state, the first elastic component may be disposed based on a position of an antenna and a nearest grounding path that can be implemented by the antenna, thereby adapting to a nearest grounding design of the electronic device in the folded state to prevent deterioration of performance of the antenna.

The first enclosure is provided with the first elastic component. Therefore, when the first enclosure and the second enclosure are in the folded state, the first elastic component may directly abut against the second enclosure, or a mechanical part that may cooperate with the first elastic component may be disposed at a position, corresponding to the first elastic component, on the second enclosure, so that the first elastic component engages with and abuts against the mechanical part. According to a specific configuration, for example, the mechanical part may be a second elastic component whose structure is the same as that of the first elastic component, or does not have a structure such as an elastic bulge or recess.

In an embodiment, the electronic device further includes a second elastic component, the second elastic component is disposed in the second enclosure, the second elastic component is disposed in correspondence with the first elastic component, the first elastic component abuts against the second elastic component when the first enclosure and the second enclosure are in the folded state, and the first electric-conductor and the second electric-conductor are electrically connected to the second elastic component through the first elastic component. The second enclosure is provided with the second elastic component. When the first enclosure and the second enclosure are in the folded state, the two elastic contact components engage with and abut against each other. An operation is labor-saving on the premise of ensuring an elastic electrical connection. In addition, a specific structure of the second elastic component may be consistent with a specific structure of the first elastic component.

In an embodiment, the second enclosure is provided with a protrusion in correspondence with the first elastic component, the protrusion is disposed in correspondence with the first elastic component, and the first elastic component abuts against the protrusion when the first enclosure and the second enclosure are in the folded state. The protrusion can be disposed easily, facilitating production and layout. In addition, the cooperation between the protrusion and the first elastic component may be implemented through cooperation between end portions of the two parts or through cooperation between side walls of the two parts. Alternatively, the second enclosure is provided with a dent in correspondence with the first elastic component, the dent is disposed in correspondence with the first elastic component, and the first elastic component extends into the dent and abuts against the dent when the first enclosure and the second enclosure are in the folded state. The dent can be provided conveniently and positions of two sides of the first elastic component are limited after the first elastic component extends into the dent. Therefore, the connection is stable.

The electronic device has two states, namely, the unfolded state and the folded state. When the first enclosure and the second enclosure are in the unfolded state, a part of the first elastic component may be located outside the first enclosure, or the first elastic component may be completely located inside the first enclosure, provided that the first enclosure is elastically and electrically connected to the second enclosure when the first enclosure and the second enclosure are in the folded state. The solution in which a part of the first elastic component is located outside the first enclosure when the first enclosure and the second enclosure are in the unfolded state can be easily implemented. Furthermore, during connection, there is an elastic force serving as a holding force to make the connection tighter. The solution in which the first elastic component is completely located inside the first enclosure when the first enclosure and the second enclosure are in the unfolded state can improve an appearance effect.

When the first enclosure and the second enclosure are in the unfolded state, a part of the first elastic component may be located outside the first enclosure. For example, one end of the first elastic component extends out of the first enclosure. When the first enclosure and the second enclosure are in the folded state, the first elastic component is squeezed by the second enclosure and is elastically and electrically connected to the second enclosure to elastically and electrically connect the first enclosure to the second enclosure. When the first enclosure and the second enclosure are in the folded state, the first elastic component is squeezed by the second enclosure, so that the first elastic component has an elastic force against the second enclosure. This is equivalent to providing a retention force for the first elastic component to abut against the second enclosure. In this way, it can be ensured that the first elastic component is in closer contact with the second enclosure and the electrical connection is more reliable. Optionally, the first enclosure is provided with a mounting groove, a first end of the first elastic component is disposed in the mounting groove, the first end of the first elastic component is connected to the first enclosure, and a second end of the first elastic component extends out of the mounting groove.

In an embodiment, the first elastic component includes an elastic mechanical part and a contact member, a first end of the elastic mechanical part is the first end of the first elastic component and is located in the mounting groove, the first end of the elastic mechanical part is connected to the first enclosure, a second end of the elastic mechanical part is connected to a first end of the contact member, and a second end of the contact member is the second end of the first elastic component and extends out of the mounting groove. The first elastic component may be implemented in a plurality of manners, provided that the first elastic component can be elastically deformed and can connect the first enclosure to the second enclosure. For ease of implementation, the first elastic component may include the elastic mechanical part and the contact member. The elastic mechanical part is configured to be elastically deformed under a force and generate an elastic force in a direction opposite to a force bearing direction. The contact member is configured to connect to and come into contact with the second enclosure.

In an embodiment in which a part of the first elastic component is located outside the first enclosure when the first enclosure and the second enclosure are in the unfolded state, the first elastic component is squeezed by the second enclosure when the first enclosure and the second enclosure are in the folded state. To ensure normal elastic contact, the first elastic component may be implemented in a plurality of manners. For example, the first end of the elastic mechanical part is fixedly connected to the first enclosure, and the second end of the elastic mechanical part is fixedly connected to the first end of the contact member. A fixed connection manner includes, but is not limited to, a buckle connection, welding, riveting, or the like.

Alternatively, the first end of the elastic mechanical part abuts against and is connected to the first enclosure, and the second end of the elastic mechanical part abuts against and is connected to the first end of the contact member.

In an embodiment in which the two ends of the elastic mechanical part abut against other objects, because the two ends of the elastic mechanical part are not fastened, a specific position and an expansion direction of the elastic mechanical part need to be considered. In addition, under the elastic force of the elastic mechanical part, if the position of the contact member is not limited, the contact member may be ejected out of the mounting groove by the elastic mechanical part and is separated from the elastic mechanical part. Therefore, in an embodiment, a side of the mounting groove facing toward the second enclosure is provided with an opening. A shape of the opening matches the contact member, the first end of the contact member is located in the mounting groove, the first end of the contact member includes a position limiter, an outer contour of the position limiter is greater than the opening of the mounting groove, and the second end of the contact member extends out of the opening of the mounting groove. The position limiter of the contact member cooperates with the opening of the mounting groove, so that motion of the contact member is limited. Even if the elastic mechanical part exerts an elastic force to the contact member, the second end of the contact member extends out of the opening of the mounting groove. However, the outer contour of the position limiter is greater than the opening of the mounting groove, the position limiter cannot pass through the opening of the mounting groove, therefore, prevents the contact member from keeping moving, and further can prevent the contact member from being ejected out by the elastic mechanical part and becoming separated.

The elastic mechanical part needs to be elastically deformed, and may be implemented in a plurality of manners, for example, an elastic block made of an elastic material or a spring. The spring is a manner that may be easily implemented. In an embodiment, the elastic mechanical part is a spring. In addition, a structure matching the spring needs to be disposed. For example, the electronic device further includes a first sleeve and a second sleeve, the first sleeve is slidably sleeved on the second sleeve, the first sleeve and the second sleeve are disposed in the mounting groove, and the spring is disposed in the first sleeve and the second sleeve. The first sleeve and the second sleeve on which the first sleeve is slidably sleeved not only can protect the spring, but also can guide and cooperate with an elastic motion of the spring.

In an embodiment in which the first sleeve is slidably sleeved on the second sleeve may be that the first sleeve is fastened to the mounting groove, an extension direction of the first sleeve is consistent with that of the second sleeve, and the first sleeve and the second sleeve are slidably sleeved together. An end of the first sleeve and an end of the second sleeve each have an opening, and the opening of the first sleeve is opposite to the opening of the second sleeve. An extension direction of the spring is consistent with that of the first sleeve. Further, the spring may be located in the first sleeve.

Because when the first enclosure and the second enclosure are in the folded state, the first elastic component is elastically deformed and is further connected to the second enclosure only after being squeezed by the second enclosure. However, because a force required by the first elastic component to undergo a deformation is approximately vertical to a force exerted to the first elastic component in a folding process of the electronic device, it is possible that the first elastic component can only prevent the electronic device from being folded and cannot be elastically deformed normally. Therefore, an edge of the first elastic component first coming into contact with the second enclosure needs to be provided with a slope that can provide guidance, so that there is an acute angle between the force exerted to the first elastic component when the electronic device is folded and the force required by the first elastic component for deformation. Further, the first elastic component can be elastically deformed successfully, and is snap-fitted and is elastically in contact with and connected to the first enclosure. In an embodiment, an end surface of the second end of the first elastic component is a slope. In the folding process of the electronic device, when the contact member is in contact with the second enclosure, the slope is configured to guide the first elastic component to be elastically deformed toward an inner portion of the first enclosure.

When the first enclosure and the second enclosure are in the unfolded state, the first elastic component may be completely located in the inner portion of the first enclosure. For example, the first elastic component is located in the inner portion of the first enclosure, the second enclosure is provided with a magnetic part in correspondence with the first elastic component, and the magnetic part is disposed in correspondence with the first elastic component. The first enclosure is provided with a mounting groove, the first end of the first elastic component is disposed in the mounting groove and is connected to the first enclosure, and the second end of the first elastic component is located in the mounting groove when the first enclosure and the second enclosure are in the unfolded state. When the first enclosure and the second enclosure are in the folded state, the second end of the first elastic component is attracted by the magnetic part, the first elastic component extends out of the mounting groove, and the first electric-conductor and the second electric-conductor are electrically connected to the magnetic part through the first elastic component. That is, when the first enclosure and the second enclosure are in the folded state, the magnetic part and the first elastic component are attracted by each other, so that an end of the first elastic component extends out of the mounting groove and is electrically connected to the second enclosure. In this way, when the first enclosure and the second enclosure are in the unfolded state, the first elastic component is located in the mounting groove and can be well hidden to improve an appearance effect of the electronic device. In addition, this can be easily implemented in an attraction manner by using the magnetic part, no extra force needs to be applied, and the part cannot be damaged easily.

In an embodiment, the first elastic component includes an elastic mechanical part and a contact member, a first end of the elastic mechanical part is the first end of the first elastic component and is disposed in the mounting groove, the first end of the elastic mechanical part is connected to the first enclosure, a second end of the elastic mechanical part is connected to a first end of the contact member, and a second end of the contact member is the second end of the first elastic component and is located in the mounting groove. The first elastic component may be implemented in a plurality of manners, provided that the first elastic component can be elastically deformed and can connect the first enclosure to the second enclosure. For ease of implementation, the first elastic component may include an elastic mechanical part and a contact member, and the elastic mechanical part is disposed in the mounting groove. The elastic mechanical part is configured to be elastically deformed under a force and generate an elastic force in a direction opposite to a force bearing direction. The contact member is configured to connect to and come into contact with the second enclosure.

In an embodiment in which the first elastic component may be completely located inside the first enclosure when the first enclosure and the second enclosure are in the unfolded state, the first elastic component is attracted by the magnetic part when the first enclosure and the second enclosure are in the folded state. To ensure normal elastic contact, the first elastic component may be implemented in a plurality of manners. For example, the first end of the elastic mechanical part is fixedly connected to the first enclosure, and the second end of the elastic mechanical part is fixedly connected to the first end of the contact member. A fixed connection manner includes, but is not limited to, a buckle connection, welding, riveting, or the like.

Alternatively, the first end of the elastic mechanical part abuts against and is connected to the first enclosure, and the second end of the elastic mechanical part abuts against and is connected to the first end of the contact member.

The elastic mechanical part needs to be elastically deformed, and may be implemented in a plurality of manners, for example, an elastic block made of an elastic material or a spring. The spring is a manner that can be easily implemented. In an embodiment, the elastic mechanical part is a spring, the first elastic component further includes a spring sleeve configured to accommodate the spring, the contact member is provided with an accommodation groove, the elastic mechanical part is located in the accommodation groove, the spring sleeve is fixedly connected to the first enclosure, an end of the spring sleeve facing toward an inner portion of the first enclosure has an opening, and an end of the spring extends out of the opening of the spring sleeve and is connected to an inner wall of the accommodation groove.

The first elastic component may be disposed based on an actual requirement. Generally, an available space inside the electronic device is small and a plurality of other functional members need to be mounted to implement other required functions, for example, a processor, a camera, and a voice output. Therefore, a space reserved for the antenna is limited, and the first elastic component may be disposed at a position close to the antenna. In an embodiment, the first enclosure is articulated with the second enclosure through an articulated shaft. The first elastic component is disposed on a side of the first enclosure far away from the articulated shaft. When the first enclosure and the second enclosure are in the folded state, the first elastic component is elastically deformed, and the first elastic component may be communicated with a side of the second enclosure far away from the articulated shaft, to elastically and electrically connect the first enclosure to the second enclosure.

In an embodiment, an elastomer is fastened to the first elastic component, and an elastic free end of the elastomer is slidably and elastically in contact with and connected to the first enclosure. When the first enclosure and the second enclosure are in the folded state, the first enclosure may be communicated with the second enclosure by using a connection relationship between the elastic mechanical part, the contact member, and the first enclosure. Alternatively, to ensure a stable electrical connection between the first enclosure and the second enclosure, the elastomer is disposed. An end of the elastomer is fastened to the first elastic component, and another end is the elastic free end and is slidably and elastically in contact with and connected to the first enclosure. In this way, when the first elastic component is deformed, the elastomer moves with the deformation. In this process, the elastomer is always slidably and elastically in contact with and connected to the first enclosure. Therefore, the stable electrical connection between the first enclosure and the second enclosure can be ensured.

In an embodiment, to implement a plurality of grounding paths, there are a plurality of first elastic components, and the plurality of first elastic components are sequentially disposed along a side edge of the first enclosure. In this way, an elastic electrical connection between each first elastic component and the second enclosure may be a nearest grounding path of an antenna, and a plurality of antennas can be grounded through a shortest path in different positional conditions.

When the first enclosure and the second enclosure are folded together, if a shape of the first enclosure matches that of the second enclosure, and the first enclosure and the second enclosure are overlapped, the first elastic component disposed on the first enclosure can be connected to the second enclosure only after thicknesses of the first enclosure and the second enclosure are eliminated. Further, the first elastic component may need to be configured as a structure with a bending portion, or a bending structure may need to be disposed on the second enclosure. However, such a solution does not facilitate production and assembly and is not beautiful enough. Therefore, in an embodiment, a side edge of the second enclosure is provided with a thickness cooperation portion, a thickness of the thickness cooperation portion is greater than or equal to a sum of the thicknesses of the first enclosure and the second enclosure, and the first elastic component elastically and electrically connects the side edge of the first enclosure to the thickness cooperation portion of the second enclosure when the first enclosure and the second enclosure are in the folded state. After the thickness cooperation portion is disposed on the second enclosure, the first elastic component may be elastically and electrically connected to the thickness cooperation portion when the first enclosure and the second enclosure are in the folded state. Further, no structure with a bending portion needs to be disposed inside the first elastic component, nor a bending structure needs to be disposed on the second enclosure. In addition, a shape of the thickness cooperation portion may be configured based on the shape of the second enclosure to ensure the appearance effect.

REFERENCE NUMERALS

01—rotating shaft; 02—left middle frame; 03—right middle frame; 04—first antenna; 05—second antenna;

1—first enclosure; 11—mounting groove; 111—opening; 2—second enclosure; 21—thickness cooperation portion; 3—first elastic component; 31—elastic mechanical part; 32—contact member; 321—position limiter; 322—elastomer; 323—accommodation groove; 33—first sleeve; 34—second sleeve; 35—spring sleeve; 36—guiding slope; 4—articulated shaft; 5—bulge.

DESCRIPTION OF EMBODIMENTS

The following clearly describes the technical solutions in embodiments of the present application with reference to the accompanying drawings in embodiments of the present application. It is clear that the described embodiments are merely some rather than all of embodiments of the present application. All other embodiments obtained by persons of ordinary skill in the art based on embodiments of the present application without creative efforts shall fall within the protection scope of the present application. Embodiments of the present application may be applied to an electronic device, including but not limited to a foldable mobile phone, a watch, a computer, or the like. A foldable structure may be a foldable display screen or a foldable housing.

Figure 1:
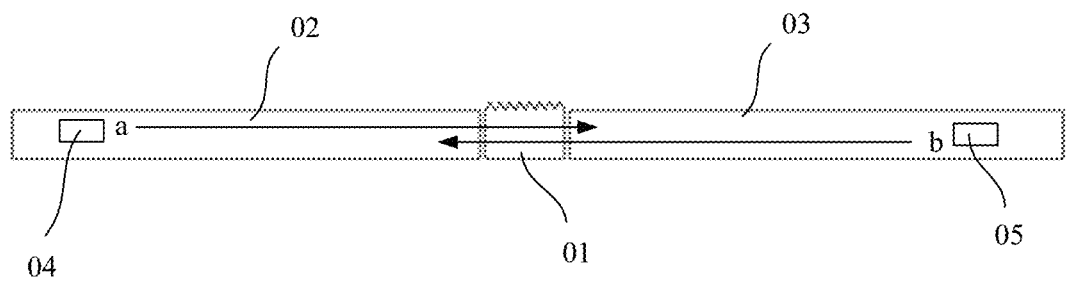
FIG. 1 is a schematic diagram of a structure of an electronic device in an unfolded state according to a conventional technology.
Figure 2:
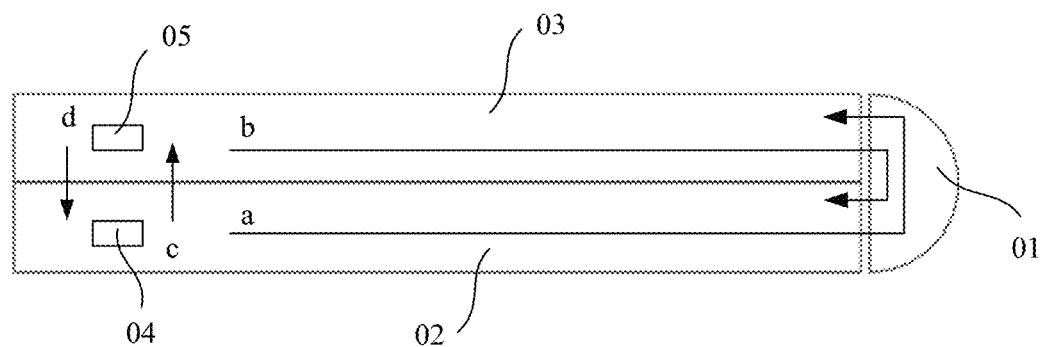
FIG. 2 is a schematic diagram of a structure of an electronic device in a folded state according to a conventional technology.

An antenna is a part configured to transmit and receive electromagnetic waves. The antenna usually needs to be fed and grounded. The grounding needs to be as short as possible and a grounding end needs to be connected in a shortest path to avoid affecting performance of the antenna. An existing electronic device has two states, namely, an unfolded state and a folded state. In an embodiment, as shown in FIG. 1 and FIG. 2, FIG. 1 is a schematic diagram of a structure of an electronic device in the unfolded state, and FIG. 2 is a schematic diagram of a structure of the electronic device in the folded state. The electronic device includes a left middle frame 02 and a right middle frame 03 that are articulated with each other through a rotating shaft 01. The left middle frame 02 may be provided with a first antenna 04, and the right middle frame 03 may be provided with a second antenna 05. Both the left middle frame 02 and the right middle frame 03 serve as grounding ends. Both the first antenna 04 and the second antenna 05 need to be connected to the grounding ends of the left middle frame 02 and the right middle frame 03. The left middle frame 02 and the right middle frame 03 are grounded through the rotating shaft 01. Refer to FIG. 1. When a first enclosure and a second enclosure are in the unfolded state, the first antenna 04 needs to be connected to both the left middle frame 02 and the right middle frame 03 to be grounded. Because the first antenna 04 is disposed on the left middle frame 02, a connection path between the first antenna 04 and the right middle frame 03 is a grounding path, that is, the grounding path of the first antenna 04 is a path a shown in FIG. 1. Because the second antenna 05 is disposed on the right middle frame 03, a connection path between the second antenna 05 and the left middle frame 02 is a grounding path, that is, the grounding path of the second antenna 05 is a path b shown in FIG. 1. In this case, because the left middle frame 02 and the right middle frame 03 are in the unfolded state, both the grounding path a and the grounding path b are shortest grounding paths. Next, referring to FIG. 2, when the first enclosure and the second enclosure are in the folded state, the grounding path of the first antenna 04 is still the path a and the grounding path of the second antenna 04 is still the path b. However, because the left middle frame 02 and the right middle frame 03 are overlapped, in spatial orientation, the first antenna 04 may be connected to the right middle frame 03 through a path c. In comparison, the path a is longer than the path c. Similarly, in spatial orientation, the second antenna 05 may be connected to the left middle frame 02 through a path d. In comparison, the path b is longer than the path d. Therefore, in the folded state, a shape of the existing electronic device is changed, and the original grounding path of the antenna is no longer the shortest grounding path. However, a long grounding path causes a current signal loss and interference. This deteriorates the performance of the antenna.

In addition, referring to FIG. 2, when the existing electronic device is in the folded state, the left middle frame 02 and the right middle frame 03 may be directly overlapped together, and are communicated with each other through two planes that are in contact with each other. However, such a contact manner cannot ensure a close connection, the electrical connection and contact may be poor, electrical conductivity is very unstable, and the performance of the antenna cannot be ensured. Furthermore, if the left middle frame 02 and the right middle frame 03 are prevented from coming into contact through insulation, the foregoing problem in which the performance of the antenna is affected because the grounding path of the antenna is not the shortest grounding path when the electronic device is in the folded state occurs.

Figure 3:
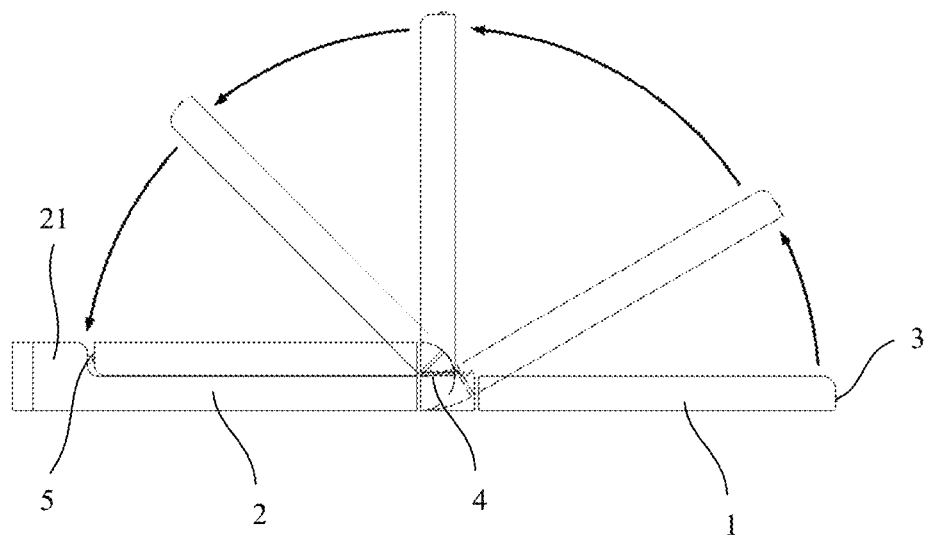
FIG. 3 is a first schematic side view of an electronic device in a folding process according to an embodiment of this application.
Figure 4:
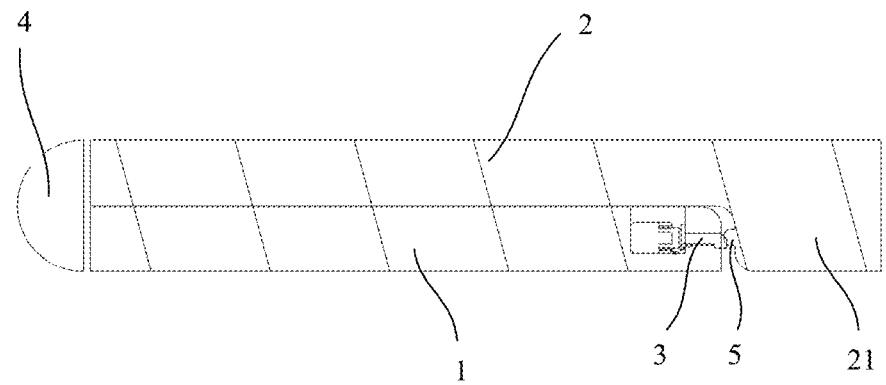
FIG. 4 is a first schematic side view of a first enclosure and a second enclosure in a folded state according to an embodiment of this application.

Referring to FIG. 3 and FIG. 4, an embodiment of this application provides an electronic device, including:
  a rotating shaft 4;
  a first enclosure 1 and a second enclosure 2, where the first enclosure 1 is rotatably connected to the second enclosure 2 through the rotating shaft 4, the first enclosure 1 includes a first electric-conductor, the second enclosure 2 includes a second electric-conductor, and the first electric-conductor is electrically connected to the second electric-conductor through the rotating shaft 4 when the first enclosure 1 and the second enclosure 2 are in an unfolded state;
  a first elastic component 3, where the first elastic component 3 is electrically conductive, and the first elastic component 3 is disposed in the first enclosure 1; and
  the first electric-conductor is electrically connected to the second electric-conductor through the first elastic component 3 when the first enclosure 1 and the second enclosure 2 are in a folded state.

According to an embodiment, because the first elastic component 3 is disposed between the first enclosure 1 and the second enclosure 2, the first elastic component 3 may elastically and electrically connect the first electric-conductor to the second electric-conductor when the first enclosure 1 and the second enclosure 2 are in the folded state. In this way, a grounding path is constructed by using the first elastic component when the electronic device is in the folded state, the first elastic component 3 may be disposed based on a position of an antenna and a shortest grounding path that can be implemented by the antenna, thereby adapting to a shortest grounding design of the electronic device in the folded state to prevent deterioration of performance of the antenna. In addition, the elastic electrical connection is close and poor contact does not occur.

Figure 5:
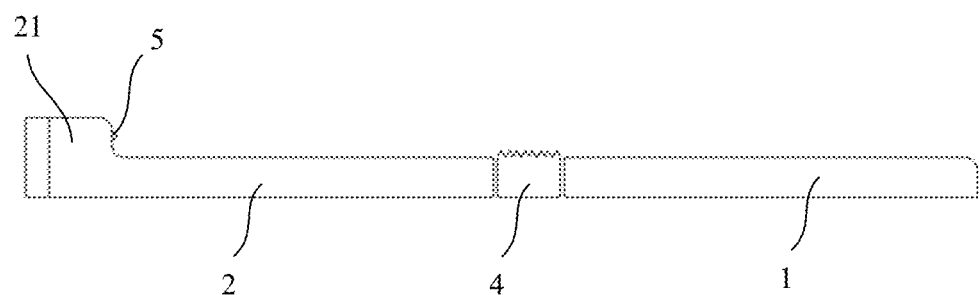
FIG. 5 is a second schematic side view of an electronic device in a folding process according to an embodiment of this application.
Figure 6:
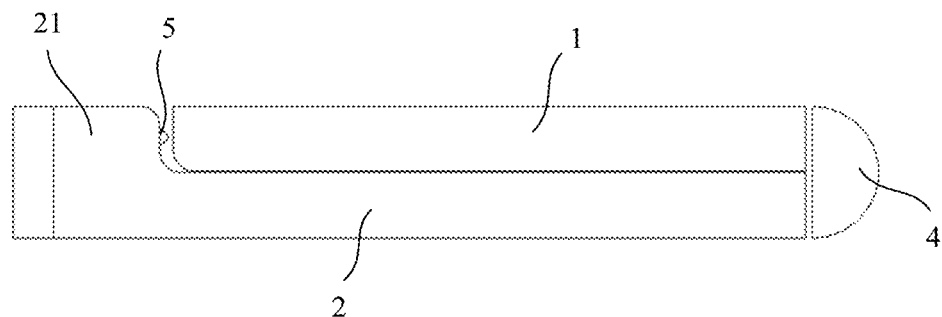
FIG. 6 is a second schematic side view of an electronic device when a first enclosure and a second enclosure are in a folded state according to an embodiment of this application.

It should be noted that the electronic device provided in this embodiment of this application has two states, namely, the unfolded state and the folded state. In an embodiment, referring to FIG. 5, the first enclosure 1 is rotatably connected to the second enclosure 2 through an articulated shaft 4, and the electronic device is in the unfolded state. In this case, the articulated shaft 4 is located between the first enclosure 1 and the second enclosure 2, and the first enclosure 1 and the second enclosure 2 are located on a same horizontal plane. Referring to FIG. 6, the electronic device is in the unfolded state. In this case, the articulated shaft 4 is located on one side of the first enclosure 1 and the second enclosure 2, and the first enclosure 1 and the second enclosure 2 are overlapped. In addition, in the electronic device in this embodiment of this application, that the enclosure 1 includes the first electric-conductor and the second enclosure 2 includes the second electric-conductor means that the electronic device generally has a grounding end. The grounding end may be an electrically conductive enclosure (for example, an enclosure made of a conductive metal), or may be another part disposed in the enclosure. Therefore, the enclosure may be made of a non-conductive material such as plastic, and cannot be directly used as a grounding end. Therefore, it is defined herein that the first enclosure 1 includes the first electric-conductor and the second enclosure 2 includes the second electric-conductor. The first enclosure 1 may be the first electric-conductor on the whole, or may include a non-conductive housing and the first electric-conductor disposed in the housing. Similarly, the second enclosure 2 may be the second electric-conductor on the whole, or may include a non-conductive housing and the second electric-conductor disposed in the housing.

The first enclosure 1 is provided with the first elastic component 3. Therefore, when the first enclosure 1 and the second enclosure 2 are in the folded state, the first elastic component 3 may directly abut against the second enclosure 2, or a mechanical part that may cooperate with the first elastic component 3 may be disposed at a position, corresponding to the first elastic component 3, on the second enclosure 2, so that the first elastic component 3 engages with and abuts against the mechanical part. According to a specific configuration, for example, the mechanical part may be a second elastic component whose structure is the same as that of the first elastic component 3, or does not have a structure such as an elastic bulge or recess.

The mechanical part engaging with and abutting against the first elastic component 3 may be implemented in a plurality of manners. For example, the electronic device further includes a second elastic component, the second elastic component is disposed in the second enclosure 2, the second elastic component is disposed in correspondence with the first elastic component 3, the first elastic component 3 abuts against the second elastic component when the first enclosure 1 and the second enclosure 2 are in the folded state, and the first electric-conductor and the second electric-conductor are electrically connected to the second elastic component through the first elastic component 3. The second enclosure 2 is provided with the second elastic component. When the first enclosure and the second enclosure are in the folded state, the two elastic contact components engage with and abut against each other. An operation is labor-saving on the premise of ensuring an elastic electrical connection. In addition, a specific structure of the second elastic component may be consistent with a specific structure of the first elastic component 3.

Alternatively, in an embodiment, the second enclosure 2 is provided with a protrusion 5 in correspondence with the first elastic component 3, the protrusion 5 is disposed in correspondence with the first elastic component 3, and the first elastic component 3 abuts against the protrusion 5 when the first enclosure 1 and the second enclosure 2 are in the folded state. The protrusion 5 can be disposed easily, facilitating production and layout. In addition, the cooperation between the protrusion 5 and the first elastic component 3 may be implemented through cooperation between end portions of the two parts or through cooperation between side walls of the two parts. Alternatively, the second enclosure 2 is provided with a dent in correspondence with the first elastic component 3, the dent is disposed in correspondence with the first elastic component 3, and the first elastic component 3 extends into the dent and abuts against the dent when the first enclosure 1 and the second enclosure 2 are in the folded state. The dent can be provided conveniently and positions of two sides of the first elastic component 3 are limited after the first elastic component 3 extends into the dent. Therefore, the connection is stable.

When the first enclosure 1 and the second enclosure 2 are in the unfolded state, a part of the first elastic component 3 may be located outside the first enclosure 1, or the first elastic component 3 may be completely located inside the first enclosure 1, provided that the first enclosure 1 is elastically and electrically connected to the second enclosure 2 when the first enclosure 1 and the second enclosure 2 are in the folded state. The solution in which a part of the first elastic component 3 is located outside the first enclosure 1 when the first enclosure 1 and the second enclosure 2 are in the unfolded state can be easily implemented. Furthermore, during connection, there is an elastic force serving as a holding force to make the connection tighter. The solution in which the first elastic component 3 is completely located inside the first enclosure 1 when the first enclosure and the second enclosure are in the unfolded state can improve an appearance effect.

Figure 7:
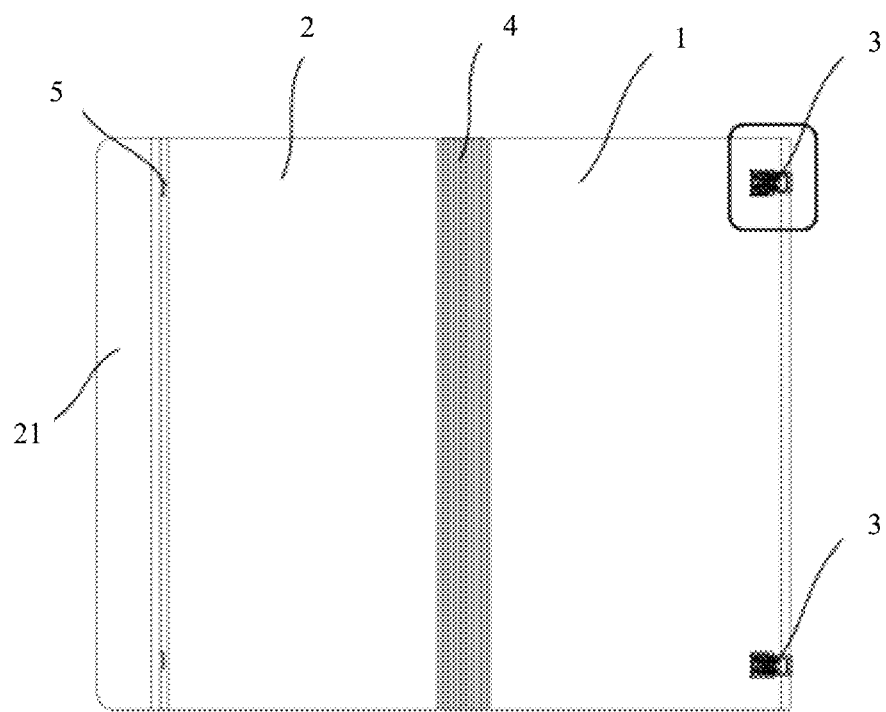
FIG. 7 is a schematic top view of an electronic device when a first enclosure and a second enclosure are in an unfolded state according to Embodiment 1 of this application.
Figure 8:
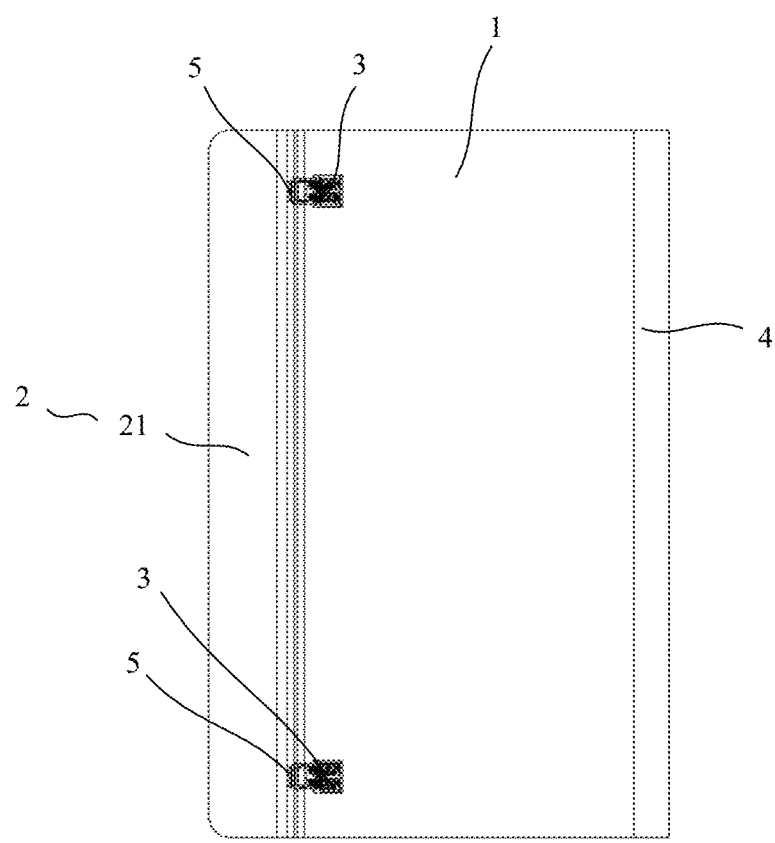
FIG. 8 is a schematic top view of an electronic device when a first enclosure and a second enclosure are in a folded state according to Embodiment 1 of this application.
Figure 9:
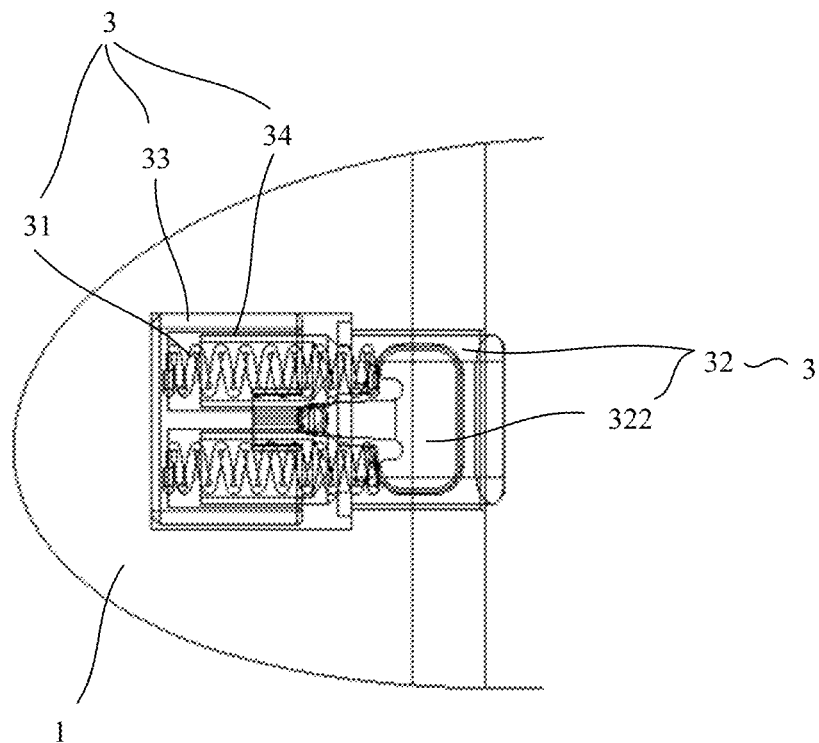
FIG. 9 is a partially enlarged view of FIG. 7.

In an embodiment, when the electronic device is in the unfolded state, a part of the first elastic component 3 may be located outside the first enclosure 1. As shown in FIG. 7, FIG. 8, and FIG. 9, when the first enclosure and the second enclosure are in the folded state, the first elastic component 3 is squeezed by the second enclosure 2 and is elastically and electrically connected to the second enclosure 2. The first enclosure 1 is elastically and electrically connected to the second enclosure 2 through the first elastic component 3. When the first enclosure 1 and the second enclosure 2 are in the folded state, the first elastic component 3 is squeezed by the second enclosure 2, so that the first elastic component 3 has an elastic force against the second enclosure 2. In this way, it can be ensured that the first elastic component 3 is in closer contact with the second enclosure 2 and the electrical connection is more reliable.

Figure 10:
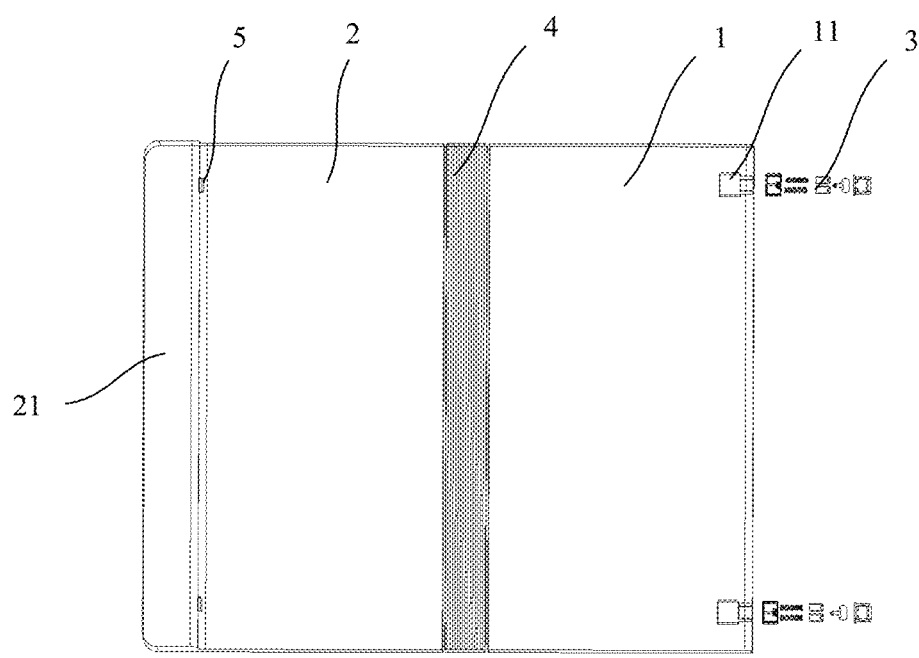
FIG. 10 is an exploded view of an elastic mechanical part of a first elastic component of an electronic device according to Embodiment 1 of this application.
Figure 11:
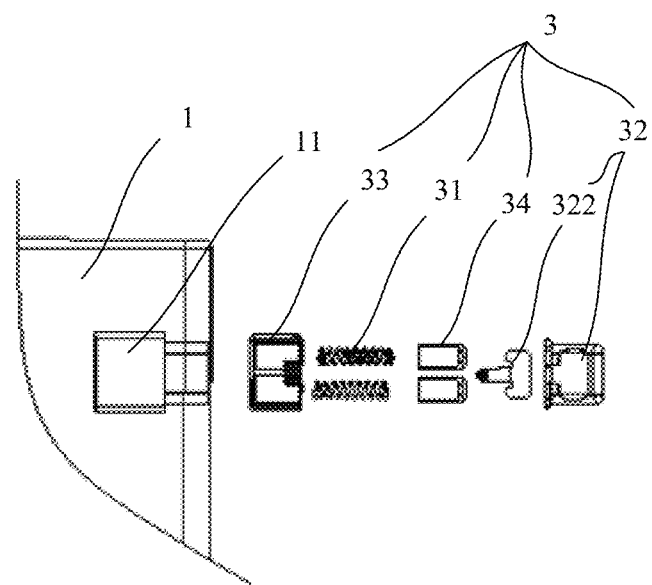
FIG. 11 is a partially enlarged view of FIG. 10.

In an embodiment, as shown in FIG. 10 and FIG. 11, the first enclosure 1 is provided with a mounting groove 11, a first end of the first elastic component 3 is disposed in the mounting groove 11, the first end of the first elastic component 3 is connected to the first enclosure 1, and a second end of the first elastic component 3 extends out of the mounting groove 11.

The first elastic component 3 may be implemented in a plurality of manners, provided that the first elastic component 3 can be elastically deformed and can connect the first enclosure 1 to the second enclosure 2. For ease of implementation, the first elastic component 3 may include an elastic mechanical part 31 and a contact member 32. The elastic mechanical part 31 is configured to be elastically deformed under a force and generate an elastic force in a direction opposite to a force bearing direction. The contact member 32 is configured to connect to and come into contact with the second enclosure 2. In an embodiment, as shown in FIG. 10 and FIG. 11, the first elastic component 3 includes an elastic mechanical part 31 and a contact member 32, a first end of the elastic mechanical part 31 is the first end of the first elastic component 3 and is located in the mounting groove 11, the first end of the elastic mechanical part 31 is connected to the first enclosure 1, a second end of the elastic mechanical part 31 is connected to a first end of the contact member 32, and a second end of the contact member 32 is the second end of the first elastic component 3 and extends out of the mounting groove 11.

Figure 12:
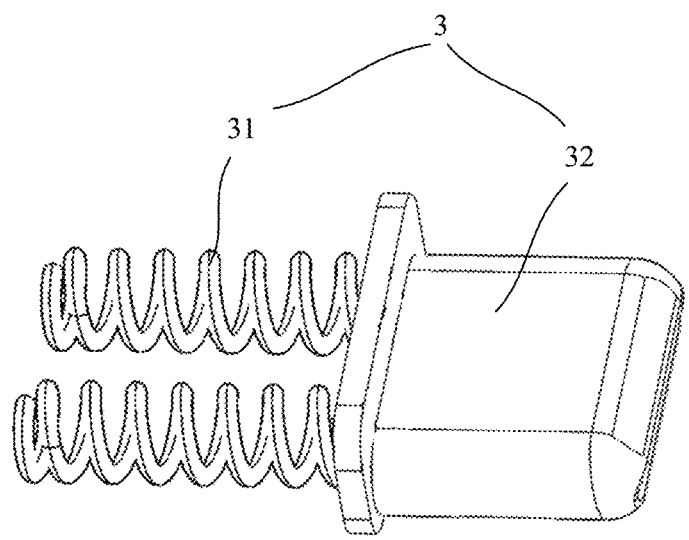
FIG. 12 is a schematic diagram of a structure in which an elastic mechanical part of a first elastic component of an electronic device is fastened to a contact member according to an embodiment of this application.

In an embodiment in which a part of the first elastic component 3 is located outside the first enclosure 1 when the first enclosure and the second enclosure are in the unfolded state, the first elastic component 1 is squeezed by the second enclosure 2 when the first enclosure 1 and the second enclosure 2 are in the folded state. To ensure normal elastic contact, the first elastic component 3 may be implemented in a plurality of manners. For example, as shown in FIG. 12, the first end of the elastic mechanical part 31 is fixedly connected to and abuts against the first enclosure 1, and the second end of the elastic mechanical part 31 is fixedly connected to and abuts against the first end of the contact member 32. A fixed connection manner includes, but is not limited to, a buckle connection, welding, riveting, or the like.

Alternatively, the first end of the elastic mechanical part 31 abuts against and is connected to the first enclosure 1, and the second end of the elastic mechanical part 31 abuts against and is connected to the first end of the contact member 32.

Figure 15:
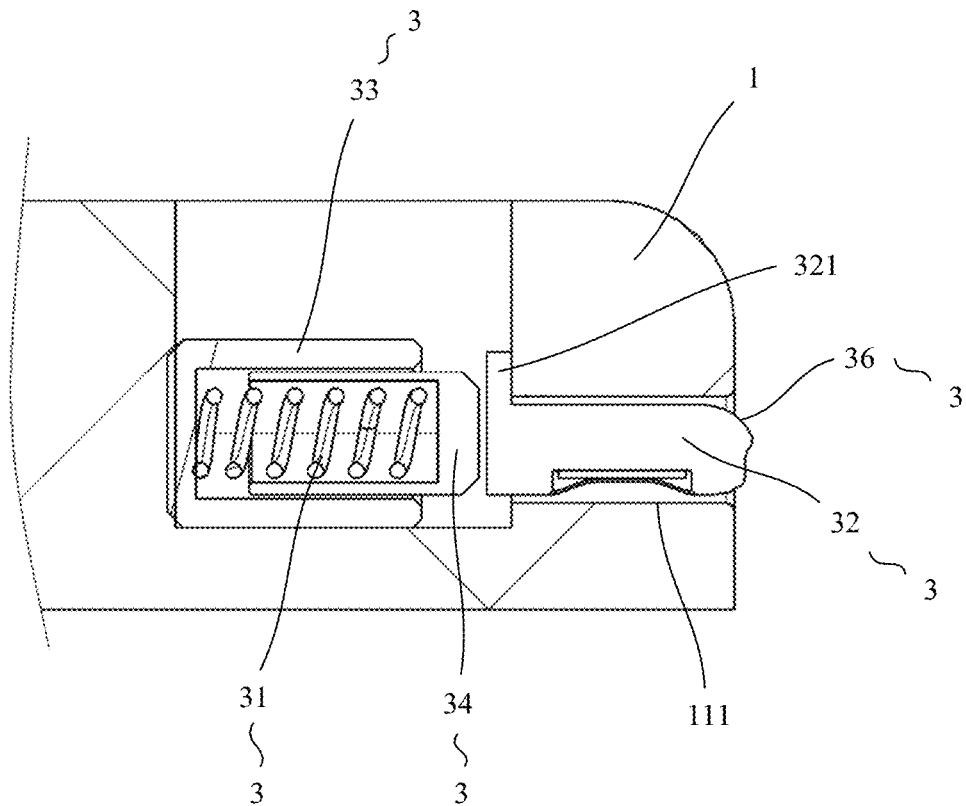
FIG. 15 is a schematic cross-sectional view showing that a first elastic component of an electronic device cooperates with a mounting groove according to an embodiment of this application.
Figure 16:
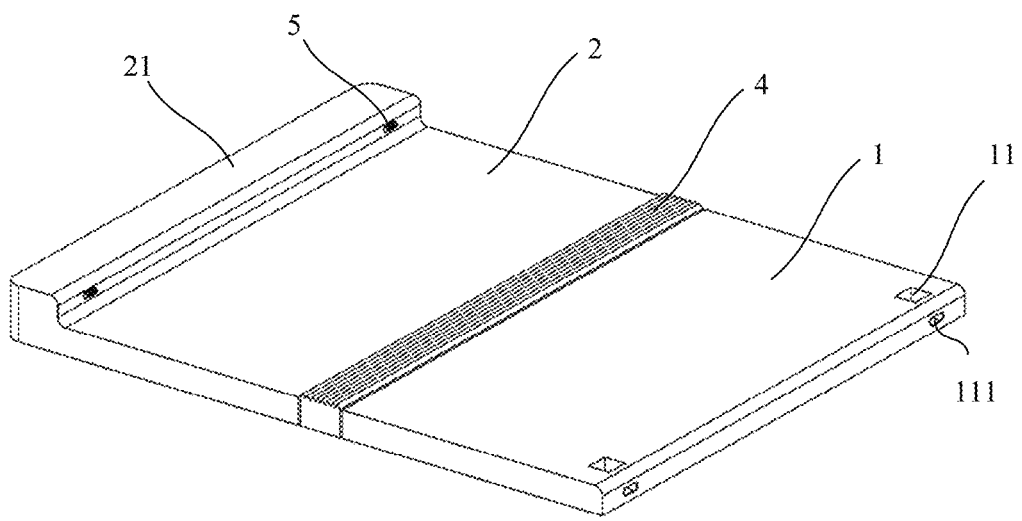
FIG. 16 is a schematic perspective view showing that a first enclosure of an electronic device is provided with a mounting groove according to an embodiment of this application.
Figure 17:
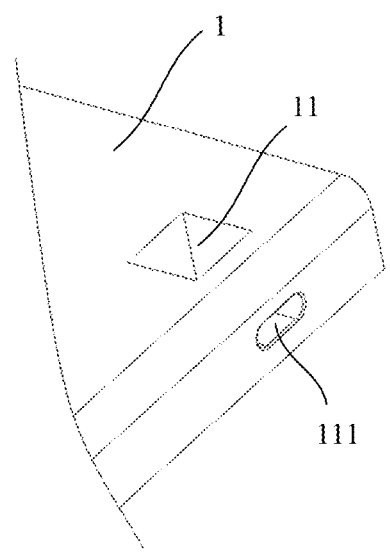
FIG. 17 is a partially enlarged view of FIG. 16.
Figure 18:
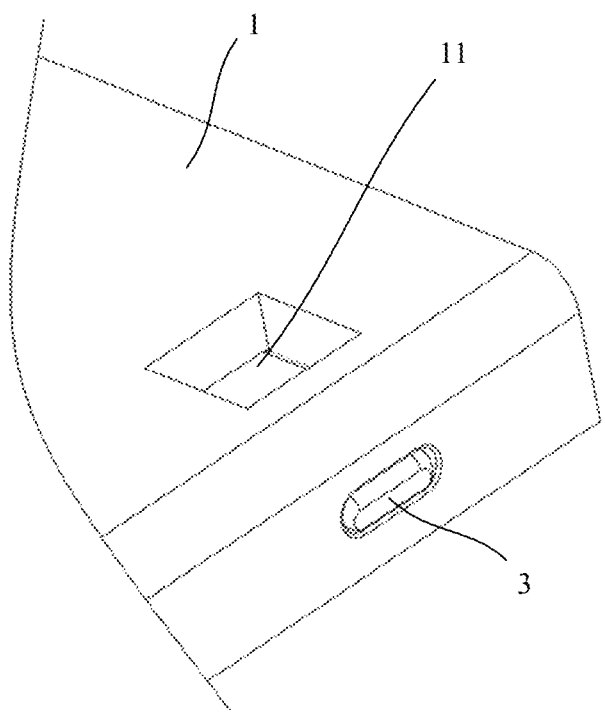
FIG. 18 is a schematic perspective view showing that a first elastic component of an electronic device is assembled to a mounting groove according to an embodiment of this application.
Figure 19:
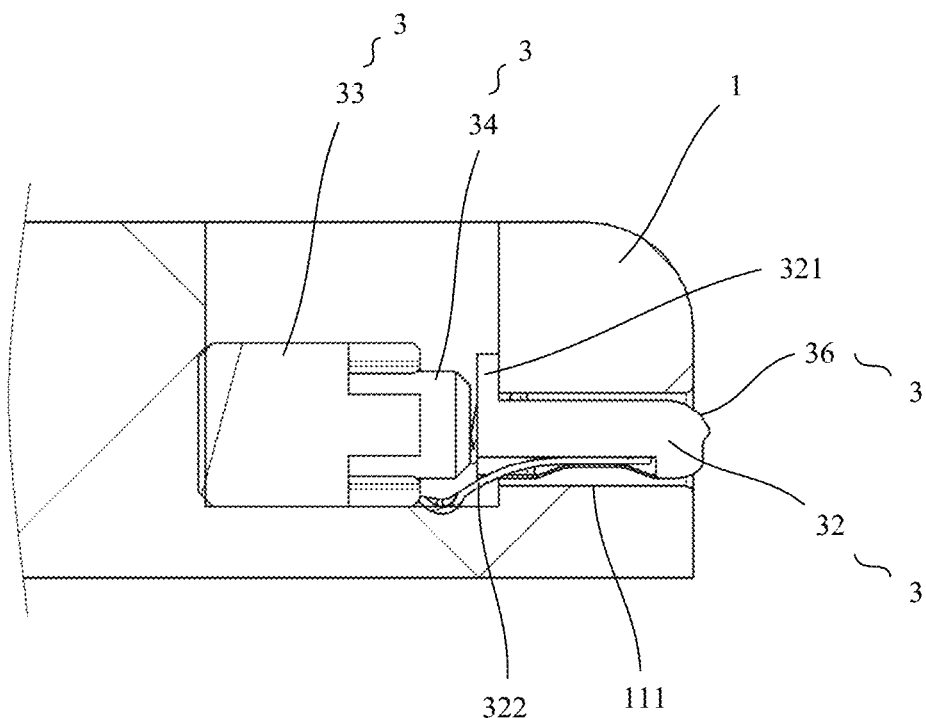
FIG. 19 is a schematic cross-sectional view showing that an elastomer disposed on a first elastic component of an electronic device cooperates with a mounting groove.

In an embodiment in which the two ends of the elastic mechanical part 31 abut against other objects, because the two ends of the elastic mechanical part 31 are not fastened, a specific position and an expansion direction of the elastic mechanical part 31 need to be considered. In addition, under the elastic force of the elastic mechanical part 31, if the position of the contact member 32 is not limited, the contact member 32 may be ejected out of the mounting groove 11 by the elastic mechanical part 31 and is separated from the elastic mechanical part 31. In an embodiment, as shown in FIG. 16, FIG. 17, and FIG. 18, a side of the mounting groove 11 facing toward the second enclosure 2 is provided with an opening 111. As shown in FIG. 15 and FIG. 19, a shape of the opening 111 matches the contact member 32, the first end of the contact member 32 extends out of the opening 111 of the mounting groove 11, the second end of the contact member 32 is located in the mounting groove 11, the first end of the contact member 32 includes a position limiter 321, an outer contour of the position limiter 321 is greater than the opening 111 of the mounting groove, and the second end of the contact member 32 extends out of the opening 111 of the mounting groove. The position limiter 321 of the contact member 32 cooperates with the opening 111 of the mounting groove 11, so that motion of the contact member 32 is limited. Even if the elastic mechanical part 31 exerts an elastic force to the contact member 32, the second end of the contact member 32 extends out of the opening 111 of the mounting groove 11. However, the outer contour of the position limiter 321 is greater than the opening 111 of the mounting groove 11, the position limiter 321 cannot pass through the opening 111 of the mounting groove 11, therefore, prevents the contact member 32 from keeping moving, and further can prevent the contact member 32 from being ejected out by the elastic mechanical part 31 and becoming separated.

It should be noted that, as shown in FIG. 16, FIG. 17, and FIG. 18, a specific structure thereof may be configured based on space and requirements, provided that the outer contour of the position limiter 321 is greater than the opening 111 of the mounting groove 11 and does not match the opening 111, and the position limiter 321 cannot pass through the opening 111. For example, as shown in FIG. 14 and FIG. 15, the position limiter 321 is a structure formed by turning an edge of the first end of the contact member 32 toward a radial direction of the contact member 32.

Figure 13:
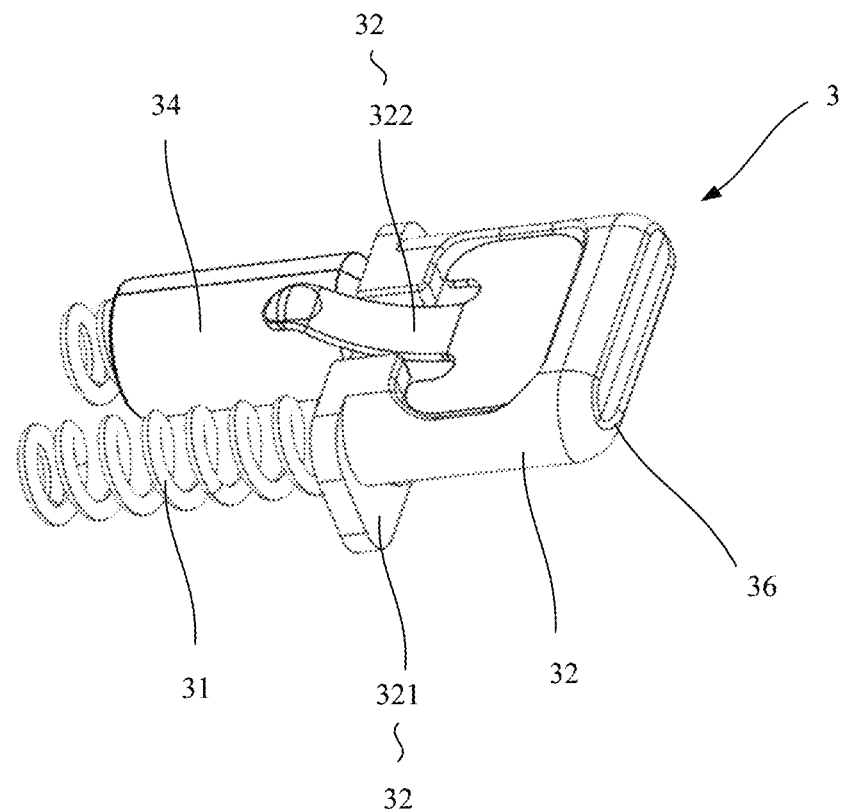
FIG. 13 is a first schematic perspective view of an elastic mechanical part of a first elastic component of an electronic device according to an embodiment of this application.

The elastic mechanical part 31 needs to be elastically deformed, and may be implemented in a plurality of manners, for example, an elastic block made of an elastic material or a spring. The spring is a manner that may be easily implemented. In an embodiment, the elastic mechanical part 31 is a spring. In addition, a structure matching the spring needs to be disposed. In an embodiment, as shown in FIG. 13 and FIG. 14, the electronic device further includes a first sleeve 33 and a second sleeve 34, the first sleeve 33 is slidably sleeved on the second sleeve 34, the first sleeve 33 and the second sleeve 34 are disposed in the mounting groove 11, and the spring is disposed in the first sleeve 33 and the second sleeve 34. The first sleeve 33 and the second sleeve 34 on which the first sleeve 33 is slidably sleeved not only can protect the spring, but also can guide and cooperate with an elastic motion of the spring.

Figure 14:
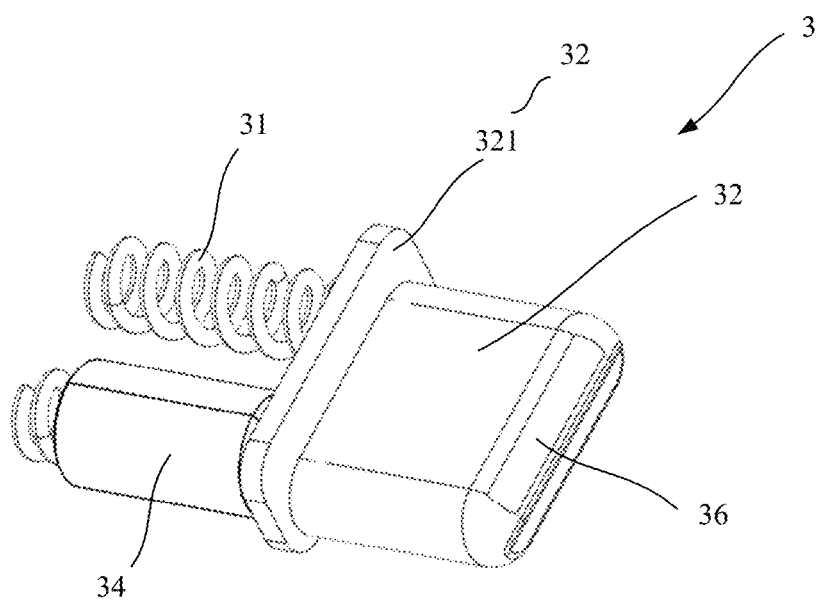
FIG. 14 is a second schematic perspective view of an elastic mechanical part of a first elastic component of an electronic device according to an embodiment of this application.

In an embodiment in which the first sleeve is slidably sleeved on the second sleeve may be that, as shown in FIG. 13 and FIG. 14, the elastic mechanical part 31 is a spring, and the first elastic component 3 further includes the first sleeve 33 and the second sleeve 34 that are configured to accommodate the spring 31. As shown in FIG. 15, the first sleeve 33 is fastened to the mounting groove 11, an extension direction of the first sleeve 33 is consistent with that of the second sleeve 34, and the first sleeve 33 and the second sleeve 34 are slidably sleeved together. An end of the first sleeve 33 and an end of the second sleeve 34 each have an opening, and the opening of the first sleeve 33 is opposite to the opening of the second sleeve 34. An extension direction of the spring is consistent with that of the first sleeve 33. Further, the spring may be located in the first sleeve 33.

Because when the first enclosure and the second enclosure are in the folded state, the first elastic component 3 is elastically deformed and is further connected to the second enclosure 2 only after being squeezed by the second enclosure 2. However, because the first elastic component 3 extends out of the first enclosure 1, in the folding process of the electronic device, a side of the first elastic component 3 may come into contact with the second enclosure 2 first, and it is possible that the first elastic component 3 can only prevent the electronic device from being folded and cannot be elastically deformed normally. Therefore, an edge of the first elastic component 3 first coming into contact with the second enclosure 2 needs to be provided with a slope that can provide guidance, so that the first elastic component 3 slides and comes into contact with the second enclosure 2 through the slope when the electronic device is folded and an end portion of the first elastic component 3 abuts against the second enclosure 2. Further, the first elastic component 3 can be elastically deformed successfully, and is elastically in contact with and connected to the second enclosure 2. Therefore, as shown in FIG. 13, FIG. 14, and FIG. 15, a side of the first elastic component 3 close to the second enclosure 2 is provided with a guiding slope 36. In the folding process of the electronic device, when the contact member 32 is in contact with the second enclosure 2, the guiding slope 36 is configured to guide the first elastic component 3 to be elastically deformed toward an inner portion of the first enclosure 1.

The first elastic component 3 may be disposed based on an actual requirement. Generally, an available space inside the electronic device is small and a plurality of other functional members need to be mounted to implement other required functions, for example, a processor, a camera, and a voice output. Therefore, a space reserved for the antenna is limited, and the first elastic component 3 may be disposed at a position close to the antenna. As shown in FIG. 5 and FIG. 6, the first enclosure 1 is articulated with the second enclosure 2 through an articulated shaft 4. The first elastic component 3 is disposed on a side of the first enclosure 1 far away from the articulated shaft 4. When the first enclosure and the second enclosure are in the folded state, the first elastic component 3 is elastically deformed, and the first elastic component 3 may be communicated with a side of the second enclosure 2 far away from the articulated shaft 4, to elastically and electrically connect the first enclosure 1 to the second enclosure 2.

It should be noted that both the first enclosure 1 and the second enclosure 2 can be electrically conductive. The first elastic component 3 elastically and electrically connects the first enclosure 1 to the second enclosure 2, so that the first enclosure 1 may be communicated with the second enclosure 2 through the first elastic component 3.

In addition, referring to FIG. 3 and FIG. 4, if the first elastic component 3 is disposed on a side of the first enclosure 1 far away from the articulated shaft 4, when the first enclosure and the second enclosure are in the folded state, two opposite side plates of the first enclosure 1 and the second enclosure 2 may be separately connected, to be specific, may be connected to the first elastic component 3 and the articulated shaft 4. In this way, if the position of the antenna is closer to the articulated shaft 4, the antenna may be communicated with the first enclosure 1 and the second enclosure 2 through the articulated shaft 4, and a grounding path is shorter. If the position of the antenna is closer to the first elastic component 3, the antenna may be communicated with the first enclosure 1 and the second enclosure 2 through the first elastic component 3, and a grounding path is shorter.

When the first enclosure and the second enclosure are in the folded state, an end of the contact member 32 is in contact with and connected to the second enclosure 2. In this case, the first enclosure 1 may be communicated with the second enclosure 2 by using a connection relationship between the elastic mechanical part 31, the contact member 32, and the first enclosure 1. Certainly, another implementation may alternatively be used. For example, as shown in FIG. 13 and FIG. 19, an elastomer 322 is fastened to the first elastic component 3, and an elastic free end of the elastomer 322 is slidably and elastically in contact with and connected to the first enclosure 1. To ensure a stable electrical connection between the first enclosure 1 and the second enclosure 2, the elastomer 322 is disposed. An end of the elastomer 322 is fastened to the first elastic component 3, and another end is the elastic free end and is slidably and elastically in contact with and connected to the first enclosure 1. When the first elastic component 3 is deformed, the first elastic component 3 undergoes an elastic deformation toward the inner portion of the first enclosure 1, and the elastomer 322 fastened to the first elastic component 3 moves with the deformation. In this process, the elastomer 322 is always slidably and elastically in contact with and connected to the first enclosure 1. Therefore, the stable electrical connection between the first enclosure 1 and the second enclosure 2 can be ensured.

In an embodiment, to implement a plurality of grounding paths, as shown in FIG. 7 and FIG. 8, there are a plurality of first elastic components 3, and the plurality of first elastic components 3 are sequentially disposed along a side edge of the first enclosure 1. In this way, an elastic electrical connection between each first elastic component 3 and the second enclosure 2 may be a nearest grounding path of an antenna, and a plurality of antennas can be grounded through a shortest path in different positional conditions.

When the first enclosure 1 and the second enclosure 2 are folded together, as shown in FIG. 2, if the left middle frame 02 and the right middle frame 03 have consistent shapes and sizes and are overlapped, when an elastic contact component is disposed at an end portion of the left middle frame 02, the elastic contact component can be connected to the end portion of the right middle frame 03 only after thicknesses of the left middle frame 02 and the right middle frame 03 are eliminated. Further, the first elastic component 3 may need to be configured as a structure with a bending portion, or a bending structure may need to be disposed on the second enclosure 2. However, such a solution does not facilitate production and assembly and is not beautiful enough. Therefore, as shown in FIG. 3 and FIG. 4, a side edge of the second enclosure 2 is provided with a thickness cooperation portion 21, a thickness of the thickness cooperation portion 21 is greater than or equal to a sum of the thicknesses of the first enclosure 1 and the second enclosure 2, and the first elastic component 3 elastically and electrically connects the side edge of the first enclosure 1 to the thickness cooperation portion 21 of the second enclosure 2 when the first enclosure and the second enclosure are in the folded state. After the thickness cooperation portion 21 is disposed on the second enclosure 2, the first elastic component 3 may be elastically and electrically connected to the thickness cooperation portion 21 when the first enclosure and the second enclosure are in the folded state. Further, no structure with a bending portion needs to be disposed inside the first elastic component 3, nor a bending structure needs to be disposed on the second enclosure 2. In addition, a shape of the thickness cooperation portion 21 may be configured based on the shape of the second enclosure 2 to ensure the appearance effect.

It should be noted that the thickness cooperation portion 21 may be integrated with the second enclosure 2 and is a part of the second enclosure 2. As shown in FIG. 3 and FIG. 4, the thickness cooperation portion 21 is a bumped structure disposed on the end portion of the second enclosure 2. In an embodiment, the thickness of the thickness cooperation portion 21 is equal to a sum of the thicknesses of the first enclosure 1 and the second enclosure 2. In this way, as shown in FIG. 4, after the electronic device is folded, an outer surface of the first enclosure 1 is aligned with a surface of the thickness cooperation portion 21, improving the appearance effect.

In an embodiment, when the first enclosure and the second enclosure are in the unfolded state, the first elastic component 3 may be completely located in the inner portion of the first enclosure. In an embodiment, as shown in FIG. 20, FIG. 21, FIG. 22, and FIG. 23, the first elastic component 3 is located in the inner portion of the first enclosure 1, the second enclosure 2 is provided with a magnetic part in correspondence with the first elastic component 3, and the magnetic part is disposed in correspondence with the first elastic component 3. The first enclosure 1 is provided with a mounting groove 11, the first end of the first elastic component 3 is connected to the first enclosure 1, and the second end of the first elastic component 3 is located in the mounting groove 11 when the first enclosure 1 and the second enclosure 2 are in the unfolded state. When the first enclosure 1 and the second enclosure 2 are in the folded state, the second end of the first elastic component 3 is attracted by the magnetic part, the first elastic component 3 extends out of the mounting groove 11, and the first electric-conductor and the second electric-conductor are electrically connected to the magnetic part through the first elastic component 3.

Figure 23:
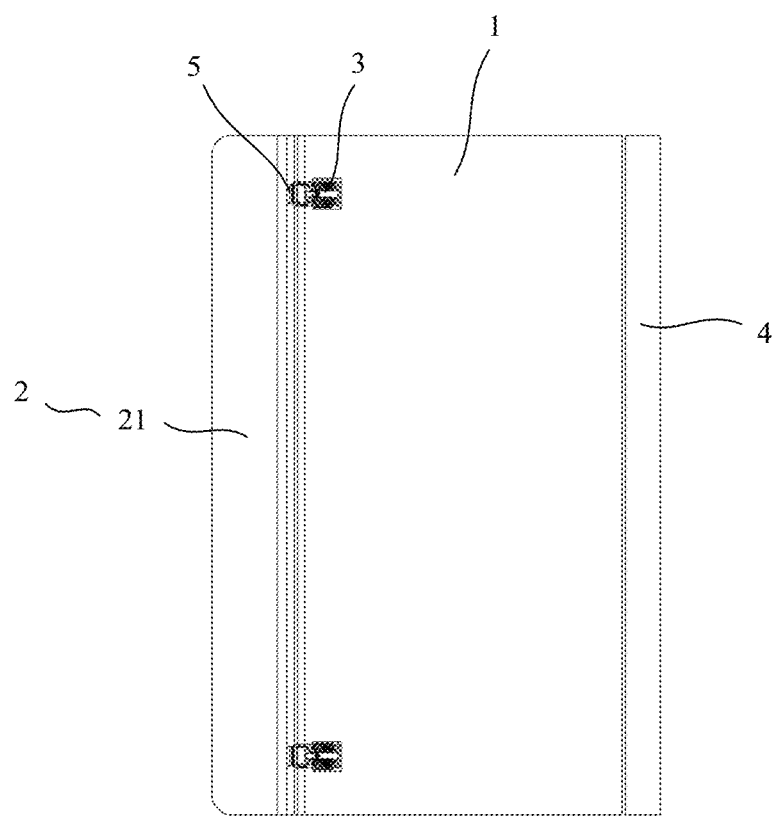
FIG. 23 is a schematic diagram of a structure of an electronic device when a first enclosure and a second enclosure are in a folded state according to Embodiment 2 of this application.

In an embodiment, when the first enclosure 1 and the second enclosure 2 are in the unfolded state, as shown in FIG. 23, the first elastic component 3 is located in the mounting groove 11 and can be well hidden to improve an appearance effect of the electronic device. In addition, this can be easily implemented in an attraction manner by using the magnetic part, no extra force needs to be applied, and the part cannot be damaged easily.

Figure 20:
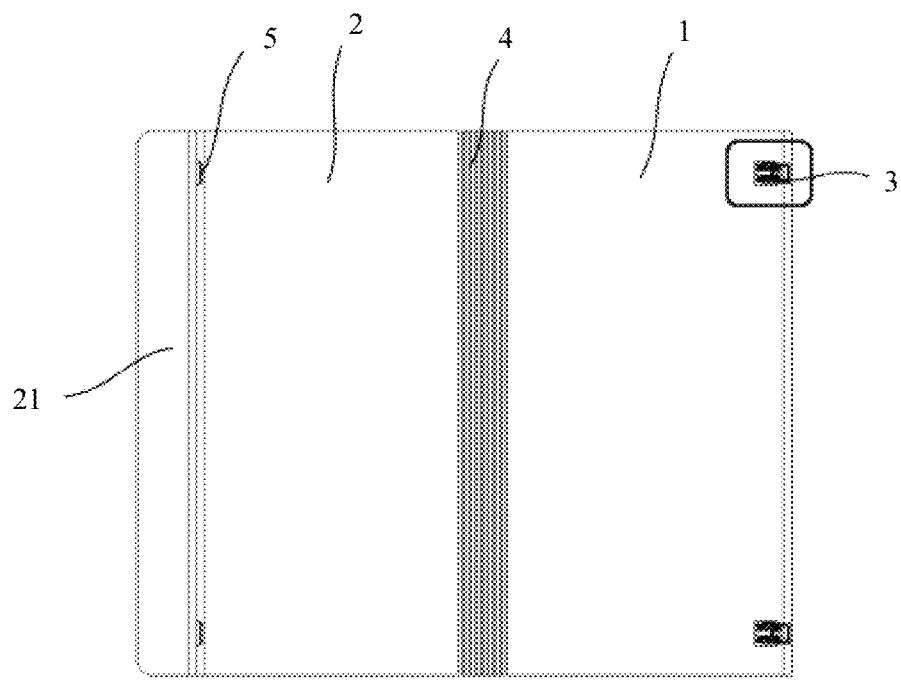
FIG. 20 is a schematic diagram of a structure of an electronic device when a first elastic component is presented in perspective and a first enclosure and a second enclosure are in an unfolded state according to Embodiment 2 of this application.
Figure 21:
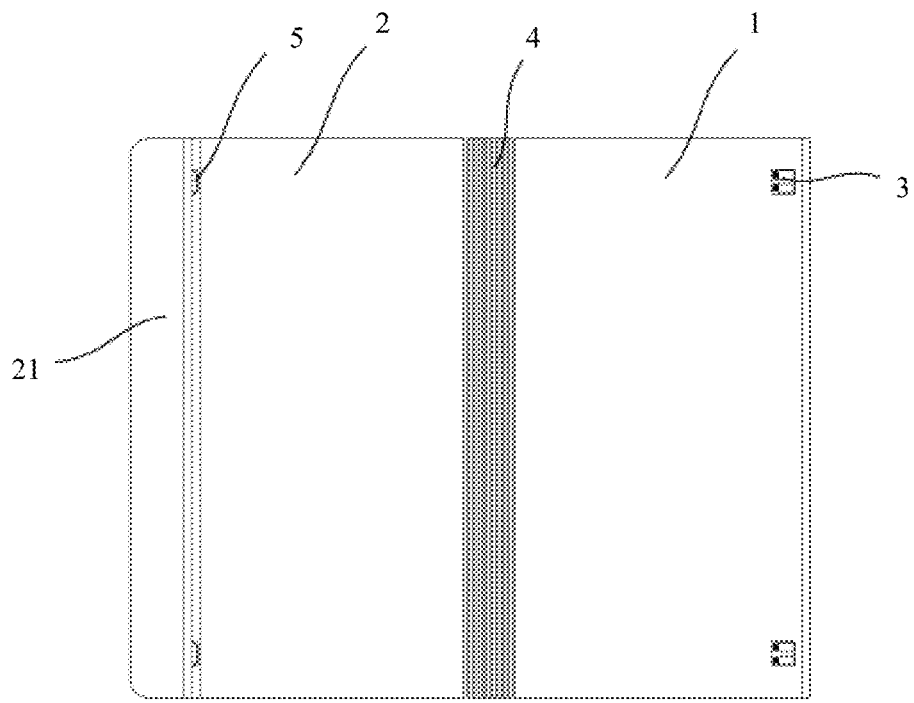
FIG. 21 is a schematic diagram of a structure of an electronic device when a first enclosure and a second enclosure are in an unfolded state according to Embodiment 2 of this application.
Figure 22:
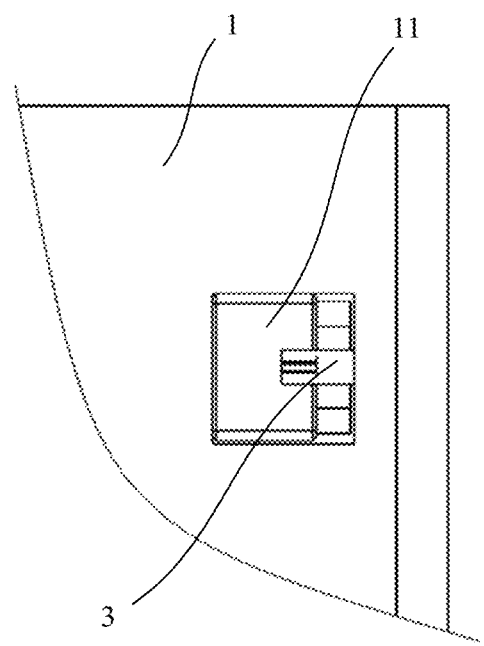
FIG. 22 is a partially enlarged view of FIG. 21.

It should be noted that FIG. 20 and FIG. 21 are both schematic diagrams of the structure in the unfolded state. The first elastic component 3 in FIG. 20 is shown in perspective merely for ease of identifying the position of the first elastic component 3. An actual appearance of the electronic device in this embodiment is shown in FIG. 21. FIG. 23 is a schematic diagram of a structure in the folded state.

Figure 24:
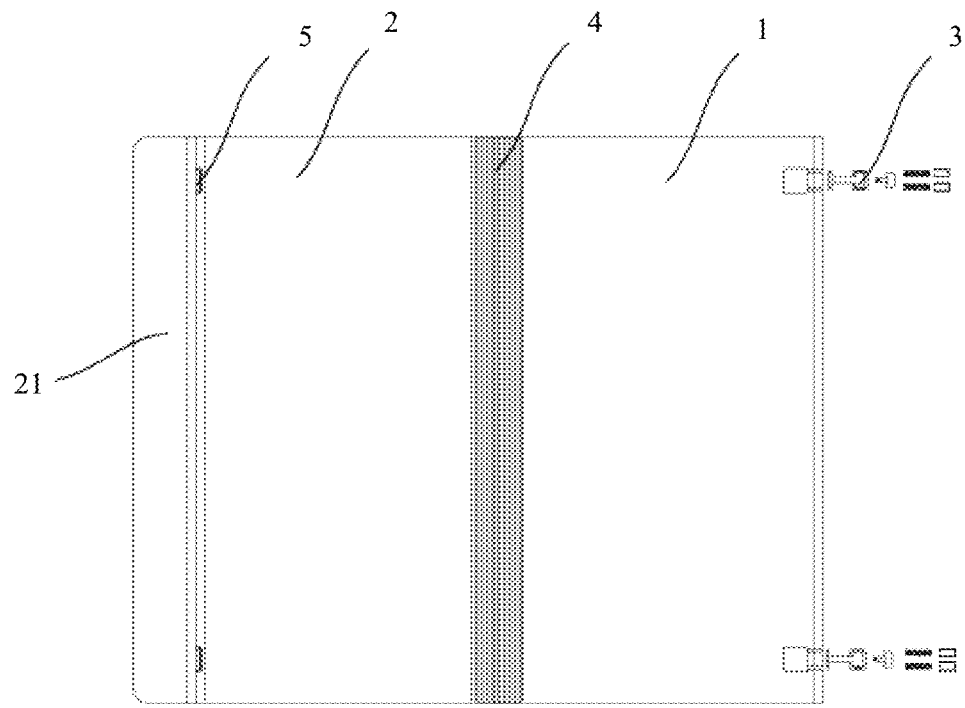
FIG. 24 is an exploded view of an elastic mechanical part of a first elastic component of an electronic device according to Embodiment 2 of this application.
Figure 25:
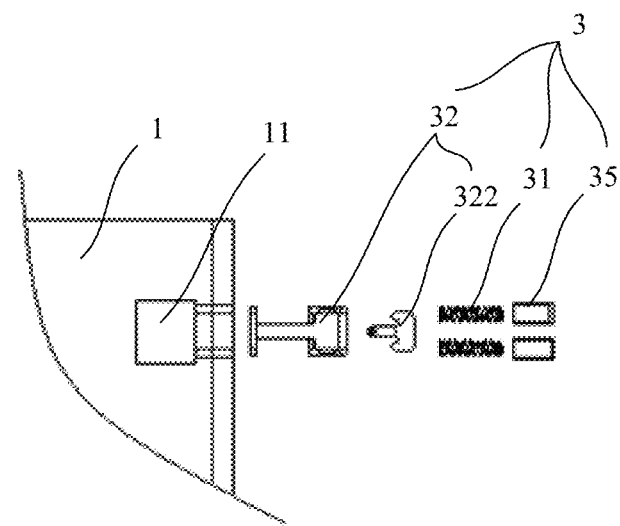
FIG. 25 is a partially enlarged view of FIG. 24.
Figure 26:
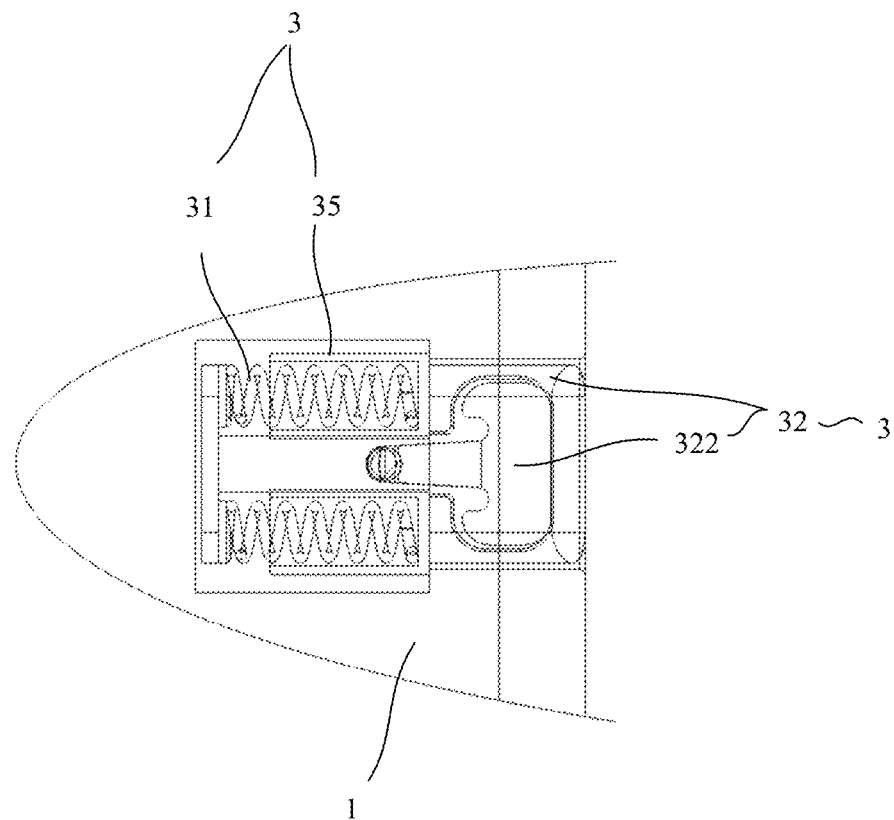
FIG. 26 is a partially enlarged view of FIG. 20.

The first elastic component 3 may be implemented in a plurality of manners, provided that the first elastic component 3 can be elastically deformed and can connect the first enclosure 1 to the second enclosure 2. For ease of implementation, the first elastic component 3 may include an elastic mechanical part 31 and a contact member 32. The elastic mechanical part 31 is configured to be elastically deformed under a force and generate an elastic force in a direction opposite to a force bearing direction. The contact member 32 is configured to connect to and come into contact with the second enclosure 2. In an embodiment, as shown in FIG. 24, FIG. 25, and FIG. 26, the first elastic component 3 includes an elastic mechanical part 31 and a contact member 32, a first end of the elastic mechanical part 31 is the first end of the first elastic component 3 and is disposed in the mounting groove 1, the first end of the elastic mechanical part 31 is connected to the first enclosure 1, a second end of the elastic mechanical part 31 is connected to a first end of the contact member 32, and a second end of the contact member 32 is the second end of the first elastic component 3 and is located in the mounting groove 11. In this way, the two ends of the elastic mechanical part 31 are respectively connected to the first enclosure 1 and the contact member 32. When the first enclosure and the second enclosure are in the folded state, the contact member 32 is attracted by the magnetic part of the second enclosure 2, and the elastic mechanical part 31 is elastically deformed, so that the contact member 32 can move toward the second enclosure 2 to come into contact with and connect to the second enclosure 2.

In an embodiment in which the first elastic component 3 is completely located in the mounting groove 11 when the first enclosure and the second enclosure are in the unfolded state, the first elastic component 1 is attracted by the magnetic part when the first enclosure and the second enclosure are in the folded state. To ensure normal elastic contact, the first elastic component 3 may be implemented in a plurality of manners. For example, as shown in Embodiment 1 and FIG. 12, a first end of the elastic mechanical part 31 is fixedly connected to and abuts against the first enclosure 1, and another end of the elastic mechanical part 31 is fixedly connected to and abuts against the contact member 32. A fixed connection manner includes, but is not limited to, a buckle connection, welding, riveting, or the like.

Alternatively, a first end of the elastic mechanical part 31 abuts against and is connected to the first enclosure 1, and another end of the elastic mechanical part 31 abuts against and is connected to the contact member 32.

Figure 27:
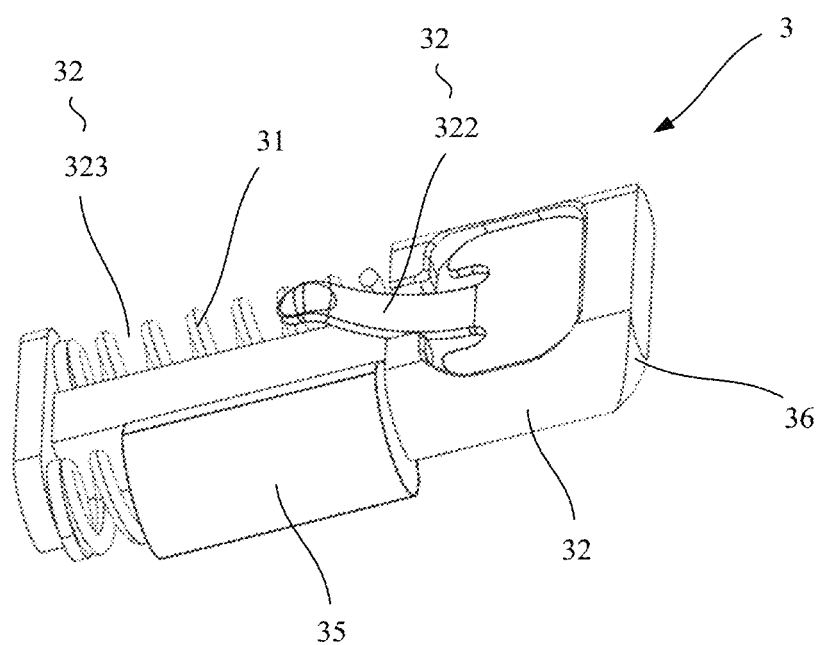
FIG. 27 is a first schematic perspective view of a first elastic component of an electronic device according to Embodiment 2 of this application.
Figure 28:
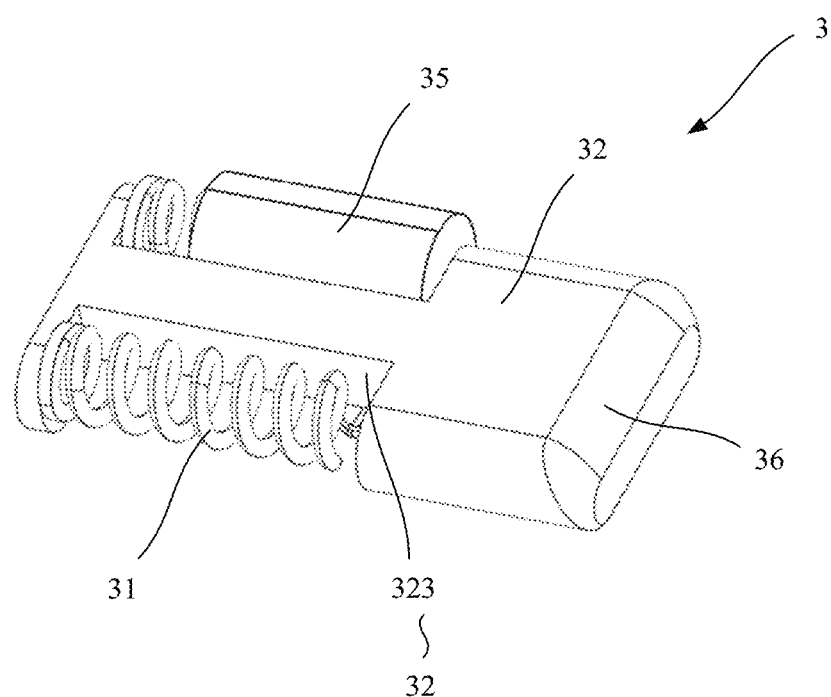
FIG. 28 is a second schematic perspective view of a first elastic component of an electronic device according to Embodiment 2 of this application.

In this case, because the two ends of the elastic mechanical part 31 are not fastened, a specific position and an expansion direction of the elastic mechanical part 31 need to be considered. In an embodiment, as shown in FIG. 26, FIG. 27, and FIG. 28, the elastic mechanical part 31 is a spring, the first elastic component 3 further includes a spring sleeve 35 configured to accommodate the spring, the contact member 32 is provided with an accommodation groove 323, the elastic mechanical part 31 is located in the accommodation groove 323, the spring sleeve 35 is fixedly connected to the first enclosure 1, an end of the spring sleeve 35 facing toward an inner portion of the first enclosure 1 has an opening, and an end of the spring extends out of the opening of the spring sleeve 35 and is connected to an inner wall of the accommodation groove 323.

It should be noted that another specific structure and disposing manner are basically the same those in Embodiment 1. In addition, in an embodiment, the first elastic component 3 is attracted by the magnetic part and extends out of the first enclosure 1. Therefore, as shown in FIG. 27 and FIG. 28, a slope 36 may or may not be disposed.

In the descriptions of this specification, the specific features, structures, materials, or characteristics may be combined in an appropriate manner in any one or more of the embodiments or examples.

Finally, it should be noted that the foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of embodiments of this application.

What is claimed is:

1. An electronic device, comprising:
    a rotating shaft;
    a first enclosure having a first electric-conductor;
    a second enclosure having a second electric-conductor, wherein the first enclosure is rotatably connected to the second enclosure through the rotating shaft;
    a first elastic component disposed in the first enclosure, and
    an elastomer fastened to the first elastic component, wherein an elastic free end of the elastomer is slidably and elastically in contact with and connected to the first enclosure, and wherein
        the first electric-conductor is electrically connected to the second electric-conductor through the rotating shaft without going through the first elastic component when the first enclosure and the second enclosure are in an unfolded state; and
        the first electric-conductor is electrically connected to the second electric-conductor through the first elastic component when the first enclosure and the second enclosure are in a folded state.

2. The electronic device of claim 1, further comprising a second elastic component disposed in the second enclosure, wherein the first elastic component abuts against the second elastic component when the first enclosure and the second enclosure are in the folded state, and wherein the first electric-conductor and the second electric-conductor are electrically connected to the second elastic component through the first elastic component.

3. The electronic device of claim 1, wherein the second enclosure further comprises a protrusion, wherein the first elastic component engages with and abuts against the protrusion when the first enclosure and the second enclosure are in the folded state.

4. The electronic device of claim 1, wherein the first enclosure further comprises a mounting groove, a first end of the first elastic component is disposed in the mounting groove, the first end of the first elastic component is connected to the first enclosure, and a second end of the first elastic component extends out of the mounting groove.

5. The electronic device of claim 4, wherein the first elastic component comprises an elastic mechanical part and a contact member, a first end of the elastic mechanical part is disposed in the mounting groove and connected to the first enclosure, a second end of the elastic mechanical part is connected to a first end of the contact member, and a second end of the contact member extends out of the mounting groove.

6. The electronic device of claim 5, wherein the first end of the elastic mechanical part is fixedly connected to the first enclosure, and the second end of the elastic mechanical part is fixedly connected to the first end of the contact member.

7. The electronic device of claim 5, wherein the first end of the elastic mechanical part abuts against and is connected to the first enclosure, and the second end of the elastic mechanical part abuts against and is connected to the first end of the contact member.

8. The electronic device of claim 7, wherein a side of the mounting groove facing toward the second enclosure comprises an opening having a shape matching the contact member, the first end of the contact member is located in the mounting groove, the first end of the contact member comprises a position limiter having an outer contour greater than the opening of the mounting groove, and the second end of the contact member extends out of the opening of the mounting groove.

9. The electronic device of claim 5, wherein the elastic mechanical part comprises a spring, wherein the electronic device further comprises:
 a first sleeve and a second sleeve disposed in the mounting groove, wherein the first sleeve is slidably sleeved on the second sleeve, and wherein the spring is disposed in the first sleeve and the second sleeve.

10. The electronic device of claim 4, wherein an end surface of the second end of the first elastic component is a slope.

11. The electronic device of claim 1, wherein the second enclosure further comprises a magnetic part;
 the first enclosure further comprises a mounting groove, a first end of the first elastic component is disposed in the mounting groove and is connected to the first enclosure, and a second end of the first elastic component is located in the mounting groove when the first enclosure and the second enclosure are in the unfolded state; and
 when the first enclosure and the second enclosure are in the folded state, the second end of the first elastic component is attracted by the magnetic part, the first elastic component extends out of the mounting groove.

12. The electronic device of claim 11, wherein the first elastic component comprises an elastic mechanical part and a contact member, a first end of the elastic mechanical part is disposed in the mounting groove, the first end of the elastic mechanical part is connected to the first enclosure, a second end of the elastic mechanical part is connected to a first end of the contact member, a second end of the contact member is located in the mounting groove when the first enclosure and the second enclosure are in the unfolded state.

13. The electronic device of claim 12, wherein the first end of the elastic mechanical part is fixedly connected to the first enclosure, and the second end of the elastic mechanical part is fixedly connected to the first end of the contact member.

14. The electronic device of claim 12, wherein the first end of the elastic mechanical part abuts against and is connected to the first enclosure, and the second end of the elastic mechanical part abuts against and is connected to the first end of the contact member.

15. The electronic device of claim 12, wherein the elastic mechanical part comprises a spring, the first elastic component further comprises a spring sleeve configured to accommodate the spring, the contact member comprises an accommodation groove containing the elastic mechanical part and the spring sleeve, the spring sleeve is fixedly connected to the first enclosure, an end of the spring sleeve facing toward an inner portion of the first enclosure has an opening, and an end of the spring extends out of the opening of the spring sleeve and abuts against and is connected to an inner wall of the accommodation groove.

16. The electronic device of claim 1, further comprising a plurality of first elastic components sequentially disposed along a side edge of the first enclosure.

17. The electronic device of claim 1, wherein the second enclosure further comprises a dent disposed in correspondence with the first elastic component, and the first elastic component engages with and abuts against the dent when the first enclosure and the second enclosure are in the folded state.

18. The electronic device of claim 2, wherein the first enclosure further comprises a mounting groove, a first end of the first elastic component is disposed in the mounting groove, the first end of the first elastic component is connected to the first enclosure, and a second end of the first elastic component extends out of the mounting groove.

19. An electronic device, comprising:
 a rotating shaft;
 a first enclosure having a first electric-conductor;
 a second enclosure having a second electric-conductor, wherein the first enclosure is rotatably connected to the second enclosure through the rotating shaft; and
 a first elastic component disposed in the first enclosure, wherein a side edge of the second enclosure comprises a thickness cooperation portion greater than or equal to a sum of thicknesses of the first enclosure and the second enclosure, and the first elastic component electrically connects the first enclosure to the thickness cooperation portion when the first enclosure and the second enclosure are in a folded state, and wherein
 the first electric-conductor is electrically connected to the second electric-conductor through the rotating shaft without going through the first elastic component when the first enclosure and the second enclosure are in an unfolded state; and
 the first electric-conductor is electrically connected to the second electric-conductor through the first elastic component when the first enclosure and the second enclosure are in the folded state.

20. An electronic device, comprising:
 a rotating shaft;
 a first enclosure having a first electric-conductor;
 a second enclosure having a second electric-conductor, wherein the first enclosure is rotatably connected to the second enclosure through the rotating shaft; and a first elastic component disposed in the first enclosure, wherein the first enclosure further comprises a mounting groove, a first end of the first elastic component is disposed in the mounting groove, the first end of the first elastic component is connected to the first enclosure, and a second end of the first elastic component extends out of the mounting groove, wherein the first elastic component comprises an elastic mechanical part and a contact member, a first end of the elastic mechanical part is disposed in the mounting groove and connected to the first enclosure, a second end of the elastic mechanical part is connected to a first end of the contact member, and a second end of the contact member extends out of the mounting groove, and wherein the first electric-conductor is electrically connected to the second electric-conductor through the rotating shaft without going through the first elastic component when the first enclosure and the second enclosure are in an unfolded state; and the first electric-conductor is electrically connected to the second electric-conductor through the first elastic component when the first enclosure and the second enclosure are in a folded state.

* * * * *